United States Patent
Villafranca et al.

(10) Patent No.: US 12,174,274 B2
(45) Date of Patent: Dec. 24, 2024

(54) OPTICAL FIBER SENSING SYSTEM HAVING GLASS DISTRIBUTED DIAMOND PARTICLES WITH NITROGEN-VACANCY (NV) CENTERS AND RELATED METHODS

(71) Applicant: EAGLE TECHNOLOGY, LLC, Melbourne, FL (US)

(72) Inventors: Evan Villafranca, West Melbourne, FL (US); Fraser R. Dalgleish, Vero Beach, FL (US); Donna M. Kocak, Indian Harbour Beach, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 434 days.

(21) Appl. No.: 17/480,667

(22) Filed: Sep. 21, 2021

(65) Prior Publication Data
US 2023/0089146 A1 Mar. 23, 2023

(51) Int. Cl.
*G01R 33/032* (2006.01)
*G01R 29/08* (2006.01)

(52) U.S. Cl.
CPC ....... *G01R 33/032* (2013.01); *G01R 29/0885* (2013.01)

(58) Field of Classification Search
CPC .......................... G01R 33/032; G01R 29/0885
USPC ......................................................... 385/24
See application file for complete search history.

(56) References Cited

U.S. PATENT DOCUMENTS

| | | | |
|---|---|---|---|
| 10,725,124 B2 | 7/2020 | Boesch et al. | |
| 2002/0110306 A1* | 8/2002 | Hamada | B82Y 20/00 385/11 |
| 2007/0277730 A1* | 12/2007 | Rabeau | H04L 9/0852 380/279 |
| 2008/0181567 A1* | 7/2008 | Bookbinder | G02B 6/02366 385/127 |
| 2015/0253355 A1* | 9/2015 | Grinolds | G01Q 60/38 850/40 |
| 2019/0154766 A1* | 5/2019 | Lutz | G01R 15/245 |

FOREIGN PATENT DOCUMENTS

| | | | |
|---|---|---|---|
| CN | 104360152 A * | 2/2015 | ............ G01R 23/02 |
| CN | 110510885 | 11/2019 | |
| WO | 2009038850 | 3/2009 | |

OTHER PUBLICATIONS

Ruan et al., Nanodiamond in Tellurite Glass Part II: Practical Nanodiamond-Doped Fibers; Optical Materials Express 73, vol. 5, No. 1. dated Dec. 9, 2014.
Bai et al., Fluorescent Diamond Microparticle Doped Glass Fiber for Magnetic Field Sensing; APL Matter 8, 081102; Aug. 3, 2020.
(Continued)

*Primary Examiner* — Jerry M Blevins
(74) *Attorney, Agent, or Firm* — ALLEN, DYER, DOPPELT + GILCHRIST, P.A.

(57) ABSTRACT

An optical fiber distributed sensing system may include an optical fiber for distributed sensing. The optical fiber may include a core including glass and diamond particles with nitrogen-vacancy (NV) centers distributed within the glass. The optical fiber may also include at least one glass layer surrounding the core. An optical source may be coupled to the optical fiber and operable from an end thereof. An optical detector may be coupled to the optical fiber to detect fluorescence therefrom.

20 Claims, 3 Drawing Sheets

(56) References Cited

OTHER PUBLICATIONS

Ruan et al., Magnetically Sensitive Nanodiamond-Doped Tellurite Glass Fibers; Scientific Reports published Jan. 19, 2018.
Maayani et al., Distributed Quantun Fiber Magentometry; Massachusetts Institute of Technology, Cambridge, MA.

* cited by examiner

OPTICAL FIBER SENSING SYSTEM HAVING GLASS DISTRIBUTED DIAMOND PARTICLES WITH NITROGEN-VACANCY (NV) CENTERS AND RELATED METHODS

FIELD OF THE INVENTION

The present invention relates to the field of electronics, and, more particularly, to optical fiber sensing systems and related methods.

BACKGROUND OF THE INVENTION

An optical fiber may provide a convenient platform for distributed sensing architectures, for example, underground and/or underwater distributed sensing architectures. However, in underground and/or underwater environments, for example, sensing of radio frequency (RF) signals may be relatively difficult. Distributed sensing permits an external signal to be located and probed along the length of an optical fiber. The external signal may be used to monitor and track entities near the optical fiber sensor.

Various techniques exist for implementing distributed sensing in an optical fiber. These techniques address acoustic frequency sensing as well as temperature and strain sensing. Acoustic frequency sensing techniques include collection of optical Rayleigh scattering or pulsed light backscattering for detecting motion of individuals/vehicles. Other techniques include using Brillouin amplification/attenuation of phase-modulated light to sense mechanical vibrations (~Hz), temperature or strain along the optical fiber, and using optical fiber Bragg gratings for four-dimensional (4D) underwater seismic measurements.

U.S. Pat. No. 10,725,124 to Boesch et al. is directed to a system for magnetic detection that includes a nitrogen vacancy (NV) diamond material including NV centers, a radio frequency (RF) excitation source configured to provide RF excitation to the NV diamond material, an optical excitation source configured to provide optical excitation to the NV diamond material, an optical detector configured to receive an optical signal emitted by the NV diamond material, and a controller. The optical signal is based on hyperfine states of the NV diamond material. The controller is configured to detect a gradient of the optical signal based on the hyperfine states emitted by the NV diamond material.

SUMMARY OF THE INVENTION

An optical fiber distributed sensing system may include an optical fiber for distributed sensing. The optical fiber may include a core that includes glass and a plurality of diamond particles with nitrogen-vacancy (NV) centers distributed within the glass, and at least one glass layer surrounding the core. An optical source may be coupled to the optical fiber and operable from an end thereof. An optical detector may be coupled to the optical fiber to detect fluorescence therefrom.

The at least one glass layer surrounding the core may include a first glass layer surrounding the core and being devoid of diamond particles with NV centers, and a second glass layer surrounding the first glass layer and comprising a field-dependent index changing material, for example. The at least one glass layer surrounding the core may include a third glass layer surrounding the second glass layer.

The optical source may include an optical emitter at the end of the optical fiber. The optical emitter may include a pulsed laser, for example.

The optical source may include a plurality of optical emitters fixed along a length of the optical fiber and associated wiring accessible at the end of the optical fiber. The optical detector may be at an end of the optical fiber opposite the end at which the optical source is operable from, for example.

The optical detector may include at least one photodiode and a filter associated therewith, for example. The optical fiber distributed sensing system may include a magnetic field generator adjacent the optical fiber. The optical fiber distributed sensing system may include an outer jacket surrounding the optical fiber, for example.

A method aspect is directed to a method for distributed sensing. The method may include positioning an optical fiber for distributed sensing. The optical fiber may include a core that includes glass and a plurality of diamond particles with nitrogen-vacancy (NV) centers distributed within the glass, and at least one glass layer surrounding the core. The method may also include coupling an optical source to the optical fiber and operable from an end thereof, and coupling an optical detector to the optical fiber to detect fluorescence therefrom.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
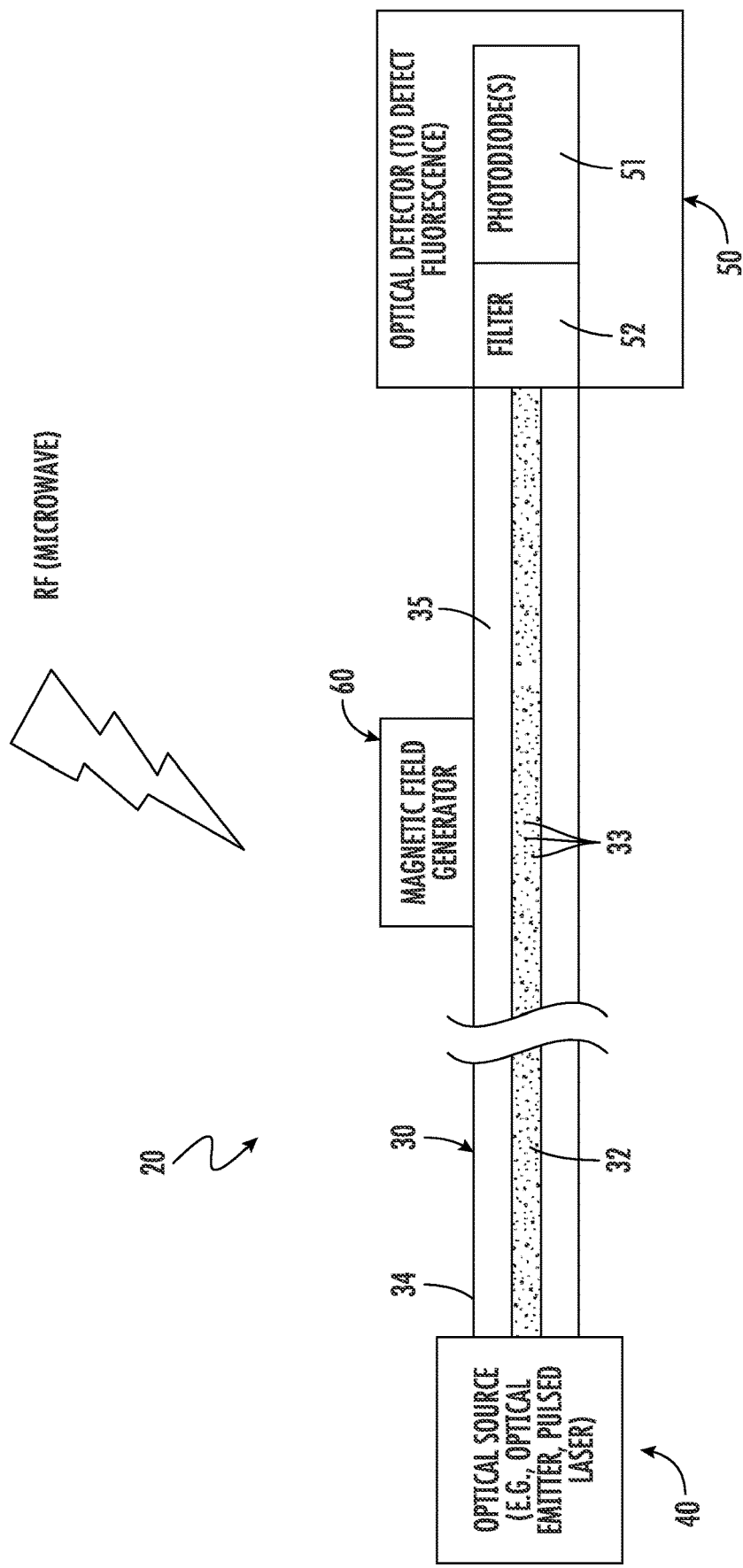
FIG. 1 is a schematic diagram of an optical fiber distributed sensing system in accordance with an embodiment.

Referring initially to FIG. 1, an optical fiber distributed sensing system 20 may include an optical fiber 30 for distributed sensing. The optical fiber 30 illustratively includes a core 31 that includes glass 32 and diamond particles with nitrogen-vacancy (NV) centers 33 distributed within the glass. The diamond particles with NV centers 33 may in the form of a nano-diamond powder including nanometer or micron sized particles with NV defects.

Figure 2:
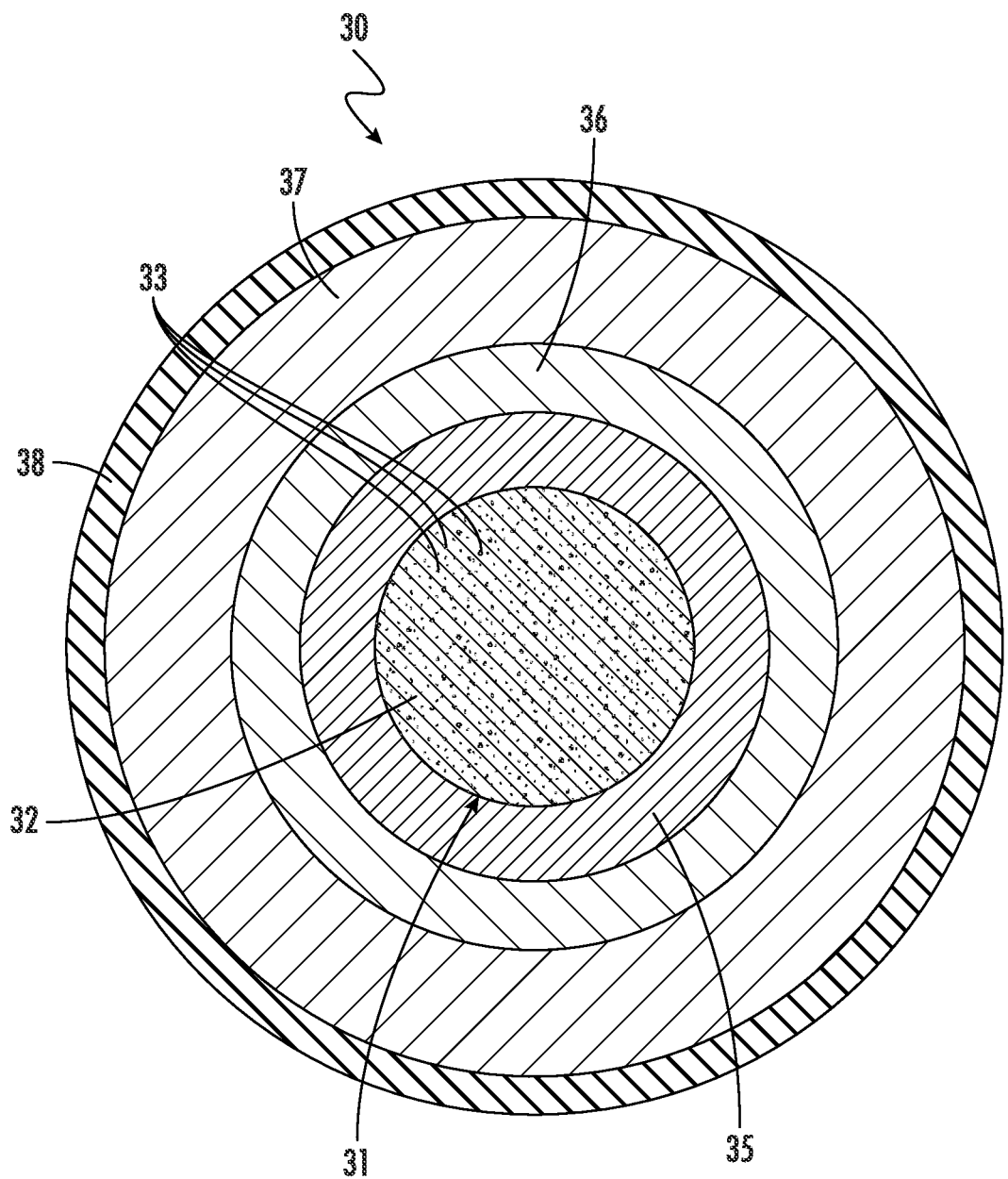
FIG. 2 is a more detailed cross-sectional view of the optical fiber of FIG. 1.

Referring additionally to FIG. 2, a first glass layer 35 surrounds the core 31. The first glass layer 35 may be the same glass material as the core 31, for example, silica or tellurite. The first glass layer 35 may be devoid of diamond particles with NV centers 33. The first glass layer 35 provides an open region for light to propagate to a second glass layer 36 surrounding the first glass layer 35. The second glass layer 36 includes field-dependent index changing material, for example, lithium niobate or doped silicon. The second glass layer 36 guides a fraction of the light to an end of the fiber for detection. A third glass layer 37 surrounds the second glass layer 36. The third glass layer 37 functions as an outer coating and may include the same glass material as the first and second glass layers 35, 36. An outer jacket 38 may surround the optical fiber 30.

An optical source, in the form of an optical emitter 40, is coupled to the optical fiber 30 and operable from an end 34 thereof. More particularly, the optical emitter 40 may be a pulsed laser, for example, a green laser, to optically excite the NV electrons for fluorescence collection, as will be appreciated by those skilled in the art. The green light or excitation may be modulated using a high-frequency amplitude or phase modulation, for example). The optical emitter 40 excites the embedded nanodiamonds or diamond particles with NV centers 33. NV fluorescence is guided through the core for higher efficiency detection, as will be appreciated by those skilled in the art.

An optical detector 50 is coupled to the optical fiber 30 to detect fluorescence therefrom. The optical detector is illustratively at an end 41 of the optical fiber 30 opposite the end 34 at which the optical emitter 40 is operable from. The optical detector 50 includes one or more photodiodes 51 and an associated filter 52. More particularly, the filter 52 may be coupled between the end 41 of the optical fiber 30 and the photodiodes 51. The filter 52 may a green notch filter, particularly when the optical emitter 40 is in the form of a green pulsed laser. The filter 52 and the photodiodes 51 cooperate to detect relevant portions of the NV signal.

As will be appreciated by those skilled in the art, frequency domain channel equalization techniques may be used with the modulation patterns to resolve, in time, the origin and strength of signal perturbations along the distributed sensing system. Thus, cumulative NV fluorescence spectrum is collected at the end 41 of the optical fiber 30 and processed to determine the location and strength of microwave perturbation.

A magnetic field generator 60 is adjacent the optical fiber 30. The magnetic field generator 60 generates a magnetic field, such as generated by a direct current (DC). The strength of the DC magnetic field applied by the magnetic field generator may be adjustable and defines the microwave resonance frequencies to which the NV centers of the diamond particles with NV centers 33 are sensitive. The magnetic field generator 60 may be internal to the optical fiber 30 such as, for example, by way of wire conductors running across the system, or may be external, such as, for example, a separate source.

In some embodiments, a microwave source may be included and may function to activate electrons by populating them in certain spin states. The microwave source may be external to the optical fiber 30. Such a configuration would allow for magnetic field anomaly sensing in the vicinity of the optical fiber 30 while the microwave source is being applied, thereby creating a dual-purpose sensing capability.

Figure 3:
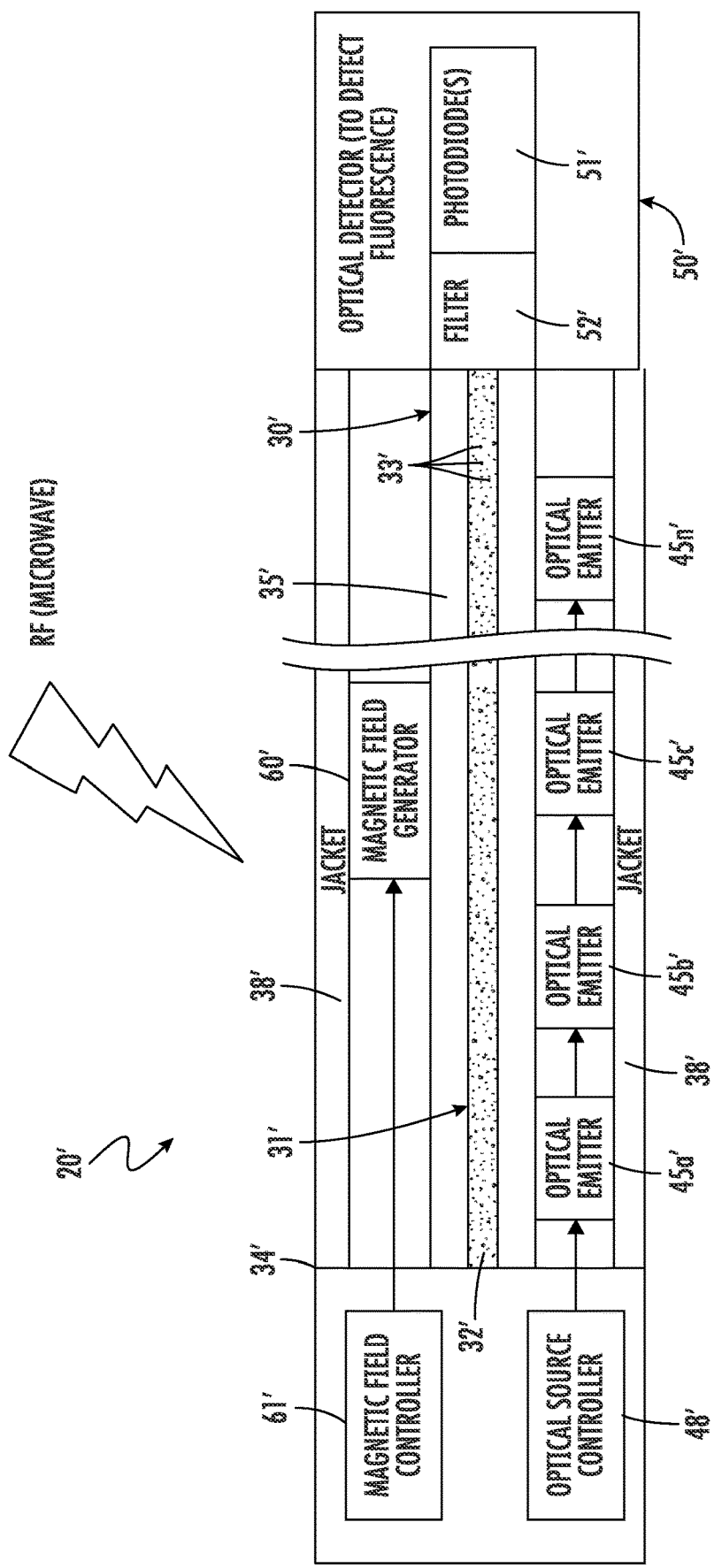
FIG. 3 is a schematic diagram of an optical fiber distributed sensing system in accordance with another embodiment.

Referring now to FIG. 3, in another embodiment of the optical fiber distributed sensing system 20', the optical source 40' may be in the form of optical emitters 45a'-45n' (e.g. a micro-light emitting diode (LED) array) along a length of the optical fiber 30'. Associated wiring 46' is accessible at the end 34' of the optical fiber 30', for example, for coupling to an optical source controller 47'. Excitation is applied at different regions along the optical fiber 30' from the optical emitters 45a'-45n'. Other elements illustrated, but not specifically described, for example, the core 30' including glass 32' diamond particles with NV centers 33', the first glass layer 35' surrounding the core, the optical detector 50' including the photodiode 51' and filter 52' are similar to those described above. Also, similar to that described above, an outer jacket 38' may surround the optical fiber 30'. A magnetic field controller 61' may be coupled to the magnetic field generator 60' by way of associated wiring 62' accessible at the end 34' of the optical fiber 30' for controlling the magnetic field generator. The magnetic field generator 60' is similar to the magnetic field generator described above.

As will be appreciated by those skilled in the art, the optical fiber distributed sensing system 20 may advantageously address the desire for microwave field sensing and spectral analysis by embedding the diamond particles with NV centers 33 into optical glass and drawing out a compound distributed sensing system. The system 20 may be particularly advantageous in underground and underwater environments, as will be appreciated by those skilled in the art. The system 20 may also permit sensing of relatively low power strengths as well as signal frequency content in the GHz range, for example. Moreover, the dual purpose of the system 20 functions as both a microwave field sensor and a signal analyzer, such as for long-range distributive sensing. The system 20 may also advantageously use time-resolved signal processing techniques to interpret microwave field perturbations in the collected NV fluorescence signal.

A method aspect is directed to a method for distributed sensing. The method includes positioning an optical fiber 30 for distributed sensing. The optical fiber 30 includes a core 31 that includes glass 32 and a plurality of diamond particles with nitrogen-vacancy (NV) centers 33 distributed within the glass 32, and at least one glass layer 35-37 surrounding the core. The method also includes coupling an optical source 40 to the optical fiber 30 and operable from an end 41 thereof, and coupling an optical detector 50 to the optical fiber 30 to detect fluorescence therefrom.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An optical fiber distributed sensing system comprising:
   an optical fiber for distributed sensing comprising
      a core comprising glass and a plurality of diamond particles with nitrogen-vacancy (NV) centers distributed within the glass, and
      at least one glass layer surrounding the core;
   an optical source coupled to the optical fiber and operable from a first end thereof;
   an optical detector coupled to the optical fiber to detect fluorescence therefrom and comprising at least one photodiode and a filter coupled between a second end of the optical fiber opposite the first end and the at least one photodiode; and
   a magnetic field generator carried by the optical fiber between the optical source and the optical detector, and configured to be operable at a resonant frequency associated with the NV centers of the diamond particles with NV centers.

2. The optical fiber distributed sensing system of claim 1 wherein the at least one glass layer surrounding the core comprises:
   a first glass layer surrounding the core and being devoid of diamond particles with NV centers; and
   a second glass layer surrounding the first glass layer and comprising a field-dependent index changing material.

3. The optical fiber distributed sensing system of claim 2 wherein the at least one glass layer surrounding the core comprises a third glass layer surrounding the second glass layer.

4. The optical fiber distributed sensing system of claim 1 wherein the optical source comprises an optical emitter at the end of the optical fiber.

5. The optical fiber distributed sensing system of claim 4 wherein the optical emitter comprises a pulsed laser.

6. The optical fiber distributed sensing system of claim 1 wherein the optical source comprises a plurality of optical emitters fixed along a length of the optical fiber and associated wiring accessible at the end of the optical fiber.

7. The optical fiber distributed sensing system of claim 1 comprising an outer jacket surrounding the optical fiber.

8. The optical fiber distributed sensing system of claim 1 comprising an outer jacket surrounding the at least one glass layer; and wherein the magnetic field generator is within the outer jacket.

9. The optical fiber distributed sensing system of claim 1 wherein the magnetic field generator comprises an adjustable field strength magnetic field generator.

10. An optical fiber cable for distributed sensing in combination with an optical source to be coupled to the optical fiber cable and operable from a first end thereof, and an optical detector to be coupled to the optical fiber cable to detect fluorescence therefrom and comprising at least one photodiode and a filter coupled between a second end of the optical fiber cable opposite the first end and the at least one photodiode, the optical fiber cable comprising:
  a core comprising glass and a plurality of diamond particles with nitrogen-vacancy (NV) centers distributed in the glass, the NV centers being responsive to at least one resonant frequency associated therewith and generated by a magnetic field generator carried by the optical fiber between the optical source and the optical detector;
  a first glass layer surrounding the core and being devoid of diamond particles with NV centers; and
  a second glass layer surrounding the first glass layer and comprising a field-dependent index changing material.

11. The optical fiber cable of claim 10 comprising a third glass layer surrounding the second glass layer.

12. The optical fiber cable of claim 11 comprising an outer jacket surrounding the third glass layer.

13. The optical fiber cable of claim 12 wherein the magnetic field generator is within the outer jacket.

14. The optical fiber cable of claim 10 wherein the magnetic field generator comprises an adjustable field strength magnetic field generator.

15. A method for distributed sensing comprising:
  positioning an optical fiber for distributed sensing, the optical fiber comprising
    a core comprising glass and a plurality of diamond particles with nitrogen-vacancy (NV) centers distributed within the glass, and
    at least one glass layer surrounding the core;
  coupling an optical source to the optical fiber and operable from a first end thereof;
  coupling an optical detector to the optical fiber to detect fluorescence therefrom, the optical detector comprising at least one photodiode and a filter coupled between a second end of the optical fiber opposite the first end and the at least one photodiode; and
  coupling a magnetic field generator carried by the optical fiber between the optical source and the optical detector, the magnetic field generator configured to be operable at a resonant frequency associated with the NV centers of the diamond particles with NV centers.

16. The method of claim 15 wherein the at least one glass layer surrounding the core comprises:
  a first glass layer surrounding the core and being devoid of diamond particles with NV centers; and
  a second glass layer surrounding the first glass layer and comprising a field-dependent index changing material.

17. The method of claim 16 wherein the at least one glass layer surrounding the core comprises a third glass layer surrounding the second glass layer.

18. The method of claim 15 wherein coupling the optical source comprises coupling an optical emitter at the end of the optical fiber.

19. The method of claim 15 wherein coupling the optical source comprises coupling a plurality of optical emitters fixed along a length of the optical fiber and associated wiring accessible at the end of the optical fiber.

20. The method of claim 15 wherein coupling the magnetic field generator comprises coupling an adjustable field strength magnetic field generator.

\* \* \* \* \*